(12) United States Patent
Isa

(10) Patent No.: US 6,774,652 B2
(45) Date of Patent: Aug. 10, 2004

(54) CANTILEVER TYPE PROBE CARD AND METHOD FOR PRODUCTION THEREOF

(75) Inventor: Yukihiro Isa, Tateyama (JP)

(73) Assignee: UMC Japan (JP)

(*) Notice: Subject to any disclaimer, the term of this patent is extended or adjusted under 35 U.S.C. 154(b) by 0 days.

(21) Appl. No.: 10/664,180

(22) Filed: Sep. 17, 2003

(65) Prior Publication Data

US 2004/0070417 A1 Apr. 15, 2004

(30) Foreign Application Priority Data

Oct. 15, 2002 (JP) .......................... 2002-300677

(51) Int. Cl.$^7$ ............................................. G01R 31/00
(52) U.S. Cl. ...................... 324/758; 324/158.1; 324/754
(58) Field of Search ................................ 324/765, 754, 324/158.1, 758, 755, 761; 439/482, 700

(56) References Cited

U.S. PATENT DOCUMENTS 4,864,227 A * 9/1989 Sato ........................... 324/758
4,951,370 A * 8/1990 Reid .......................... 29/25.35
5,134,365 A * 7/1992 Okubo et al. ............... 324/754

FOREIGN PATENT DOCUMENTS

JP JUMR-A-3038114 3/1997
JP A-2002-40052 2/2002

* cited by examiner

Primary Examiner—David A. Zarneke
Assistant Examiner—Jimmy Nguyen
(74) Attorney, Agent, or Firm—Synnestvedt Lechner & Woodbridge, LLP; Richard C. Woodbridge, Esq.

(57) ABSTRACT

This invention provides a cantilever type probe card which has undergone a treatment for facilitating perception of the image of probe needles. This invention, in the probe card 1 having disposed at prescribed positions on the probe card main body 2 such probe needles 3 furnished with bent pars 6 having the leading terminals thereof directed toward an object under test, forms in a at least the parts of the probe needles 3 including the bent parts 6 such reflection lowering parts 31 adapted to repress the reflection of light.

4 Claims, 6 Drawing Sheets

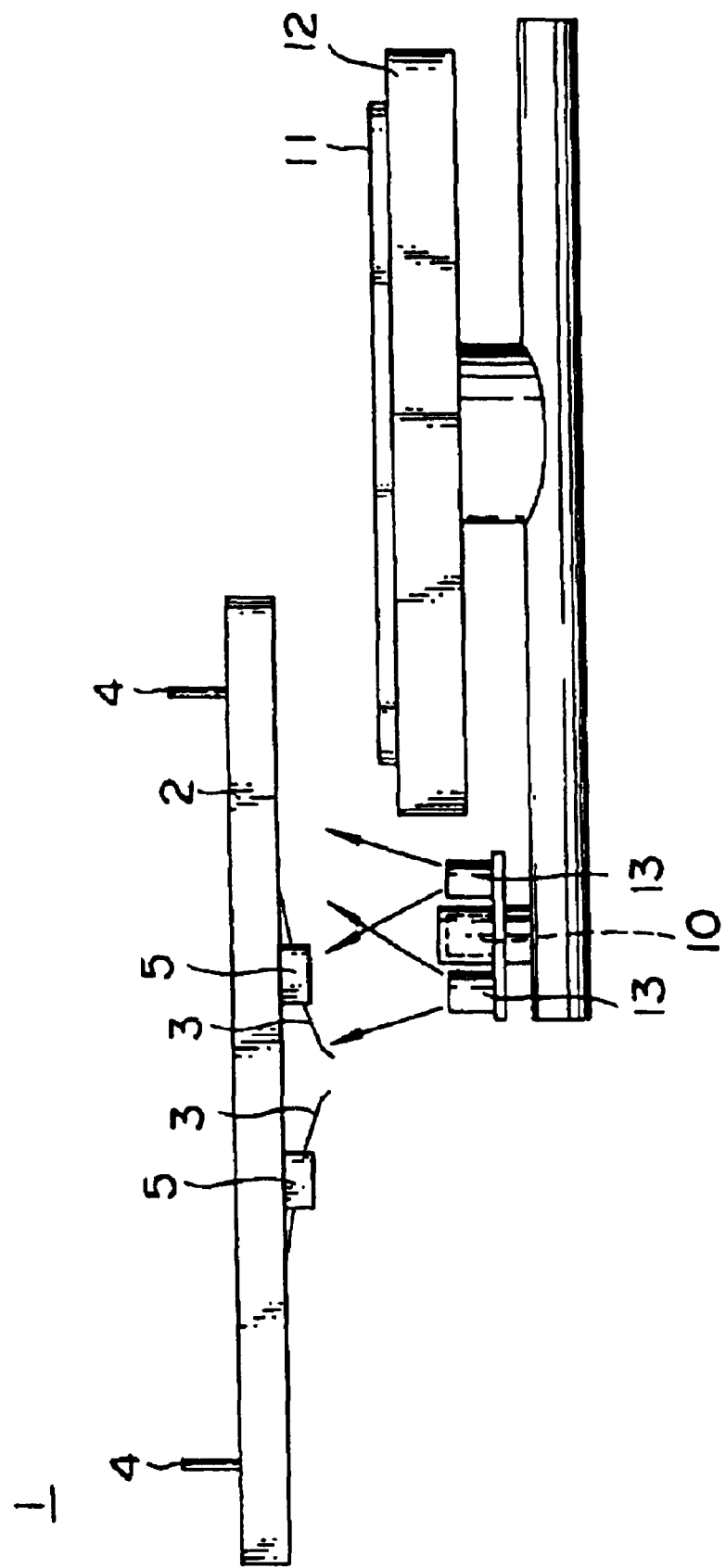

CANTILEVER TYPE PROBE CARD AND METHOD FOR PRODUCTION THEREOF

CROSS REFERENCE TO RELATED APPLICATIONS

The present application is related to, and claims priority from, Japanese Patent Application No. 2002-300677 filed on Oct. 15, 2002. The entire contents of the application is hereby incorporated by reference in its entirety.

BACKGROUND OF THE INVENTION

1. Field of the Invention

This invention relates to a cantilever type probe card and a method for the production thereof.

2. Description of the Related Art

A probe card is used for the purpose of measuring on a semiconductor wafer the performance of a device (an object under test) which is formed on the semiconductor wafer. The probe card is provided with a plurality of probe needles intended to contact a pad of the device. To test a given device for performance, the probe card is attached to a measuring apparatus called an "autoprober" and the probe needles illuminated with a lightening fixture are photographed with a camera designed exclusively for this purpose. The positions of the tips of the probe needles are perceived on the basis of the image so photographed and the position of the device is adjusted in conformity with the perceived positions.

Incidentally, since the semiconductor devices developed in recent years have been densified to a great degree, pads formed individually for the devices have become proportionately small and the intervals between the pads have become thin accordingly as well. As a result, the probe needles which are formed in the probe card have come to be disposed in high density with narrow intervals. The narrowing of the intervals between the probe needles renders the perception of accurate positions of the tips of the probe needles difficult. This is because the probe needles cause the light of illumination to be so irregularly reflected that the positions of the tips of the probe needles may not be accurately perceived from the photographed image.

As a means for solving the problem of this irregular reflection, the official gazette of JP-A-2002-40052 (Cited Reference 1) discloses a technique which, concerning a membrane type probe card having probe needles laid out in high density, consists in applying a black coat to the probe needles excepting the contact points of the probe needles that are fated to contact the pads of devices. The term "membrane type probe card" used herein means such a probe card which is obtained by forming on a film such printed wirings as are eventually formed on a wiring board and polishing the leading terminal parts of the printed wirings thereby forming contact points.

A probe card which has a plurality of needles of tungsten arranged on the main body thereof is referred to as a "cantilever type probe card." With the object of preventing this cantilever type probe card from entailing the problem of inferior insulation between the adjacent probe needles which are arranged in high density unlike the aforementioned problem of irregular reflection, the official gazette of JUMR-A-3038114 (Cited Reference 2) discloses a probe card which imparts enhanced insulation between the adjacent probe needles by coating all the probe needles individually with an insulating film by means of electrodeposition coating.

When the technique of the membrane type probe card according to the Cited Reference 1 mentioned above is to be applied to the cantilever type probe card, the probe needles are fated to be wholly coated in black, namely they are individually coated as proposed in the Cited Reference 2 mentioned above. Thus, the cantilever type probe card incorporating this technique has the problem of rendering the production thereof extremely difficult.

It is, therefore, an object of this invention to provide a cantilever type probe card which is capable of easily perceiving the positions of the tips of the probe needles.

Another object of this invention is to provide a method for the production of a cantilever type probe card which is capable of facilitating perception of the positions of the tips of the probe needles.

SUMMARY OF THE INVENTION

This invention relates to a cantilever type probe card, i.e. a probe card having disposed at prescribed positions of the main body thereof such probe needles as are each furnished at the leading terminal thereof with a bent part directed toward an object under test, wherein at least the portions of the probe needles which include the bent parts mentioned above have each formed therein a reflection-lowered part, namely a part processed to repress the reflection of light. The reflection-lowered parts mentioned above are preferred to be given a lusterless coating. Preferably these reflection-lowered parts are delustered by the treatment of brushing.

The probe card of this invention is furnished at prescribed positions of the main body thereof with probe needles each forming at the leading terminal thereof a bent part directed toward an object under test and antireflection plates covering the bent parts of the probe needles.

This invention relates to a method for the production of a cantilever type probe card, i.e. a method for producing a probe card having disposed at prescribed positions of the main body thereof such probe needles as are each provided at the leading terminal thereof with a bent part directed toward an object under test, wherein the bent parts of the probe needles mentioned above are endowed with a delustering coat by immersing at least the bent parts in a coating material while horizontally retaining the probe card in a state having the probe needles disposed at the prescribed position.

The method of this invention is directed toward the production of a probe card, i.e. a probe card having disposed at prescribed positions of the main body thereof such probe needles as are each forming a bent part directed toward an object under test, wherein at least the bent parts of the probe needles mentioned above are delustered by being brushed with a metallic brush till the probe needles sustain fine scratches.

Further, the method of this invention is directed toward the production of a probe card, i.e. a probe card having disposed at prescribed positions of the main body thereof such probe needles as are each forming a bend part directed toward an object under test, wherein antireflection plates adapted to cover the bent parts of the probe needles and provided with openings for exposing the tips of the probe needles are attached by adhesion to the main body of the probe card.

These and other features of the invention will be more fully understood by reference to the following drawings.

BRIEF DESCRIPTION OF THE DRAWINGS

FIG. 4 is a diagram drawn to illustrate the part for installing a camera intended to perceive an image in an autoprober.

During the course of this description, like numbers will be used to identify like elements according to the different views that illustrate the invention.

DETAILED DESCRIPTION OF THE INVENTION

Now, the modes of embodying this invention will be described herein below with reference to the drawings attached hereto.

MODE 1 OF EMBODIMENT

Figure 1:
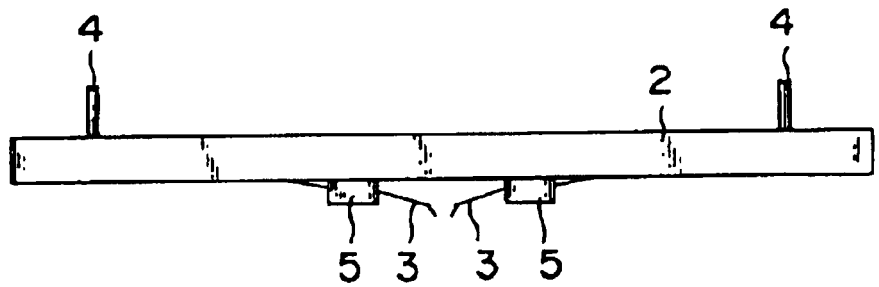
FIG. 1 is a side view of a probe card in Mode 1 of the embodiment of this invention.
Figure 2:
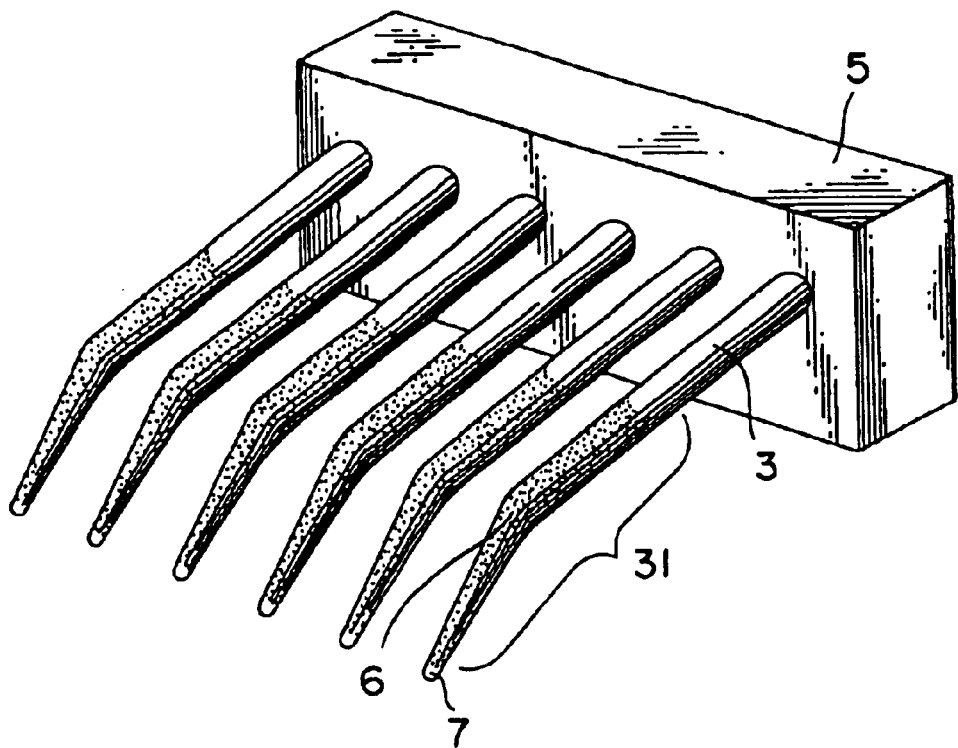
FIG. 2 is a magnified view illustrating the part of probe needles in the probe card in Mode 1 of the embodiment mentioned below.

FIG. 1 is a side view illustrating a probe card in Mode 1 of the embodiment of this invention and FIG. 2 is a magnified view illustrating the part of probe needles in the probe card.

A probe card 1 is composed of a probe card main body 2 and probe needles 3 retained at prescribed positions by the probe card main body 2.

The probe card main body 2 is formed of a printed wiring board such as an epoxy board or a ceramic board. The probe card main body 2 is furnished with a terminal 4 adapted to be connected to a socket in such a measuring device as an autoprober. The terminal 4 and the probe needles 3 are electrically connected with a printed wiring (not shown).

The probe needles 3 are fixed at prescribed positions of the probe card main body 2 with respective resin members 5. The probe needles 3, as illustrated in FIG. 2, are extended from the probe card main body till the leading terminal parts thereof are bent in the direction of contacting a device (in the downward direction in the bearings of the diagram). The parts thus bent will be referred to hereinafter as bent parts 6. The probe needles 3, as illustrated, are made to include the bent parts 6 therein and are furnished therein, excepting the needle tips 7 adapted to contact the device, with parts which have been treated to repress reflection of light (reflection-lowered parts 31).

FIG. 3 is a diagram drawn to explain a method for production which subjects the probe needles 3 to a treatment for lowering the reflection of light. Mode 1 of the embodiment has the probe needles 3 attached to the probe card main body 2 before subjecting the probe needles 3 to the treatment for lowering the reflection of light.

Figure 3A:
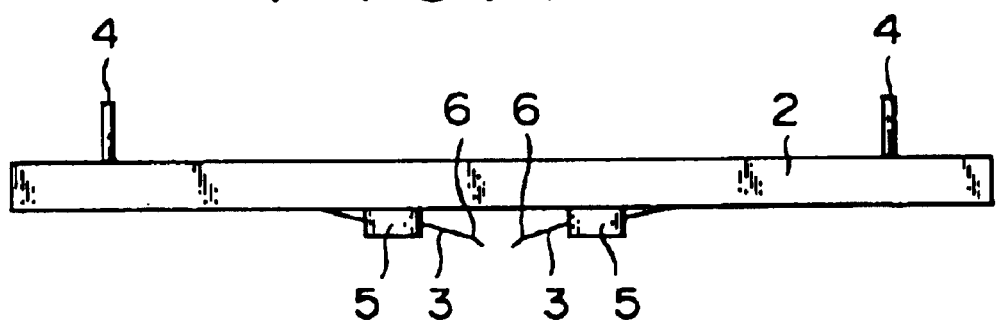
FIG. 3 is a diagram drawn to explain a method of production which is performed for the purpose of delustering the probe needles mentioned below.
Figure 3B:
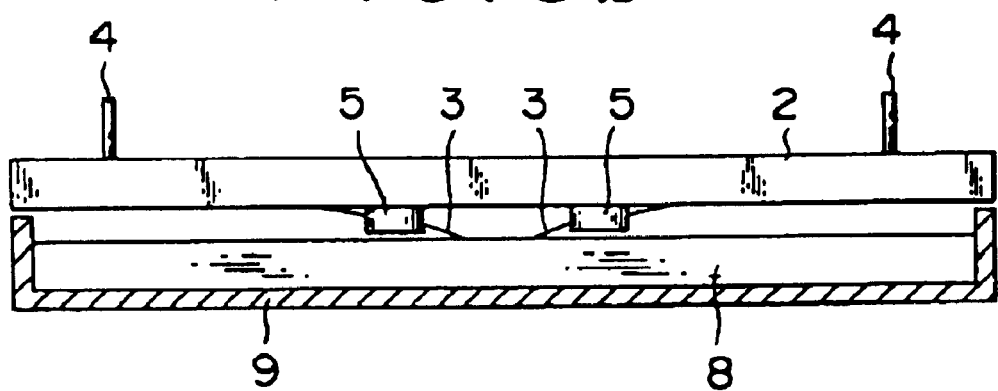

For a start, the probe needles 3 are attached to the probe card main body 2 and the probe card 1 not yet given a treatment for lowering the reflection of light is retained horizontally as illustrated in FIG. 3a. Then, the probe card 1 is lowered in the direction of a coating bath 9 filled with a coating material 8 till the probe needles 3 are immersed from the leading terminals thereof through at least the bent parts 6 in the coating material 8 as illustrated in FIG. 3b. The coating material 8 which is used herein is an insulating acrylic type coating material, for example, which is preferred to have such a color as delustered black or gray which does not easily reflect light.

Then, the probe card 1 is removed from the coating material 8 and left drying. As a result, the probe needles 3 including the bent parts 6 and extending to the leading terminals thereof assume a coated state. Thereafter, by subjecting the needle tips 7 illustrated in FIG. 2 to a work of grinding, it is made possible to expose the metal of the needle tips 7 which are parts fated to contact the pad of a device and finish the reflection-lowered parts 31 including the bent parts 6 and excluding the needle tips 7.

By simply immersing the needle tips 7 of the probe card 1 not yet given a treatment for lowering the reflection of light and now held in a horizontal state in the coating material 8 as described above, the probe needles 3 are enabled to be easily subjected to a work of lowering the reflection of light.

Now, the function of the probe card in Mode 1 of the embodiment will be described below.

FIG. 4 is a diagram drawn to illustrate the part for installing a camera intended to perceive an image in an autoprober.

The autoprober, as illustrated in the diagram, has disposed below the probe card 1 a camera 10 which is intended to perceive the image of needle tips of the probe card 1. The position at which the camera 10 is installed is in the proximity of a wafer chuck 12 into which a wafer 11 is inserted.

Lighting devices 13 are disposed around the camera 10 and adapted to illuminate the probe needles 3 from below. As a result, the probe needles 3 irregularly reflect the light of illumination to the extent of rendering perception of the image of needle tips 7 difficult to attain.

FIG. 5 is a diagram illustrating in type section the reflections by illumination of the probe needle parts respectively of a cantilever type probe card not given any antireflection treatment and a membrane type probe card.

Figure 5A:
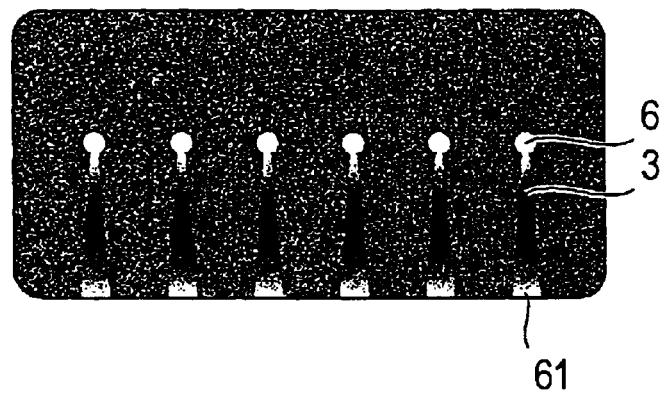
FIG. 5 is a diagram illustrating in type section the reflections by illumination of the probe needle parts respectively of a cantilever type probe card not given any antireflection treatment and a membrane type probe card.

The conventional cantilever type probe card, as illustrated in FIG. 5a, is nearly incapable of perceiving the needle tips because the bent parts 6 reflect the light of illumination most strongly. The bent parts 6 through the basal parts 61 of the probe needles 3, however, do not reflect the light very strongly.

Figure 5B:
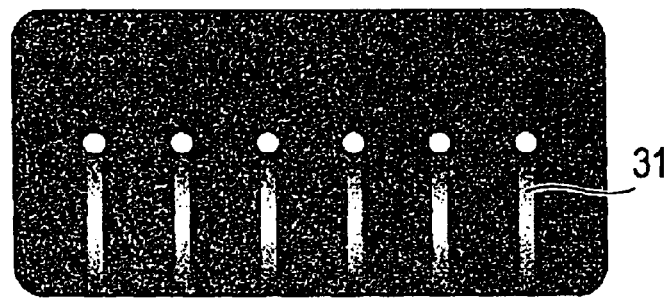

In contrast, in the membrane type probe card, as illustrated in FIG. 5b, contact needles wholly show a sign of reflection.

Figure 6:
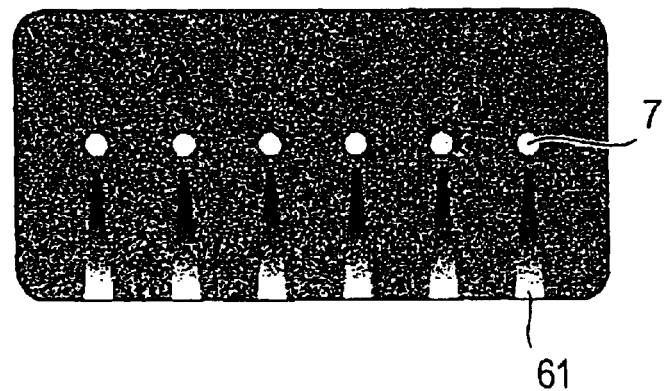
FIG. 6 is a diagram illustrating in type section the reflection by illumination of the probe needle part of a probe card in Mode 1 of the embodiment.

FIG. 6 is a diagram illustrating in type section the reflection by illumination of the probe needle part of a probe card in Mode 1 of the embodiment.

Since the probe card 1 in Mode 1 of the embodiment, as illustrated in FIG. 6, has the part thereof extending from the bent parts 6 through the needle tips already subjected to a treatment for lowering the reflection of light, the bent parts 6 do not reflect light and only the needle tips 7 reflect the light of illumination and permit themselves to be perceived easily. Though the basal parts 61 of the probe needles have not been subjected to a treatment for lowering the reflection of light, they do not affect the perception of the needle tips 7.

From this fact, it is seen that the cantilever type probe needles 3 are enabled by having the parts thereof including the bent parts 6 subjected to a treatment for lowering the reflection of light to attain easy perception of the needle tips 7.

In accordance with Mode 1 of the embodiment, the cantilever type probe card 1 is enabled, by having the parts of the probe needles 3 including the bent parts 6 subjected to a treatment for lowering the reflection of light, to repress the reflection from the bent parts 6 which reflect light most strongly and enhance the ratio of perception of the image of needle tips.

Further, the coat applied to the probe needles 3 serves the purpose of preventing metallic dust from adhering to the probe needles 3. Even when metallic dust happens to adhere to the probe needles 3, the coat formed of an insulating coating material can prevent the adjacent probe needles from forming a short circuit or inducing leakage through the medium of such metallic dust.

The method of production contemplated in Mode 1 of the embodiment performs the treatment for lowering the reflection of light by applying a delustering coat to the probe needles 3 after the probe card 1 has been manufactured. Thus, the treatment for lowering the reflection of light can be implemented even on the probe card 1 which has been already manufactured.

Besides the application of the coat, the treatment of the probe needles 3 for lowering the reflection of light may be accomplished by brushing with a metallic brush the parts of the probe needles 3 extending from the bent parts 6 through the needle tips thereby inflicting fine scratches to the surfaces of the probe needles and delustering the probe needles.

MODE 2 OF EMBODIMENT

Figure 7:
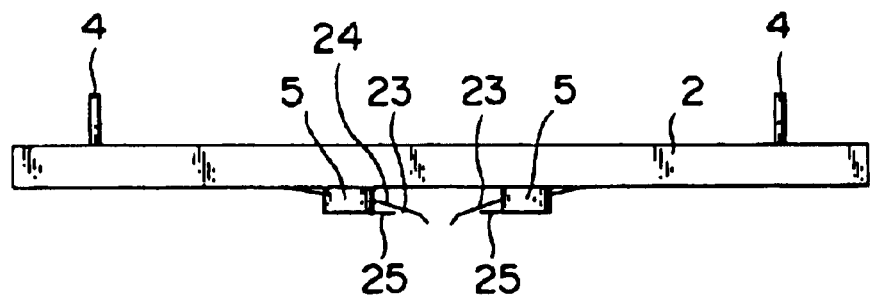
FIG. 7 is a side view illustrating a probe card in Mode 2 of the embodiment of the present invention.
Figure 8:
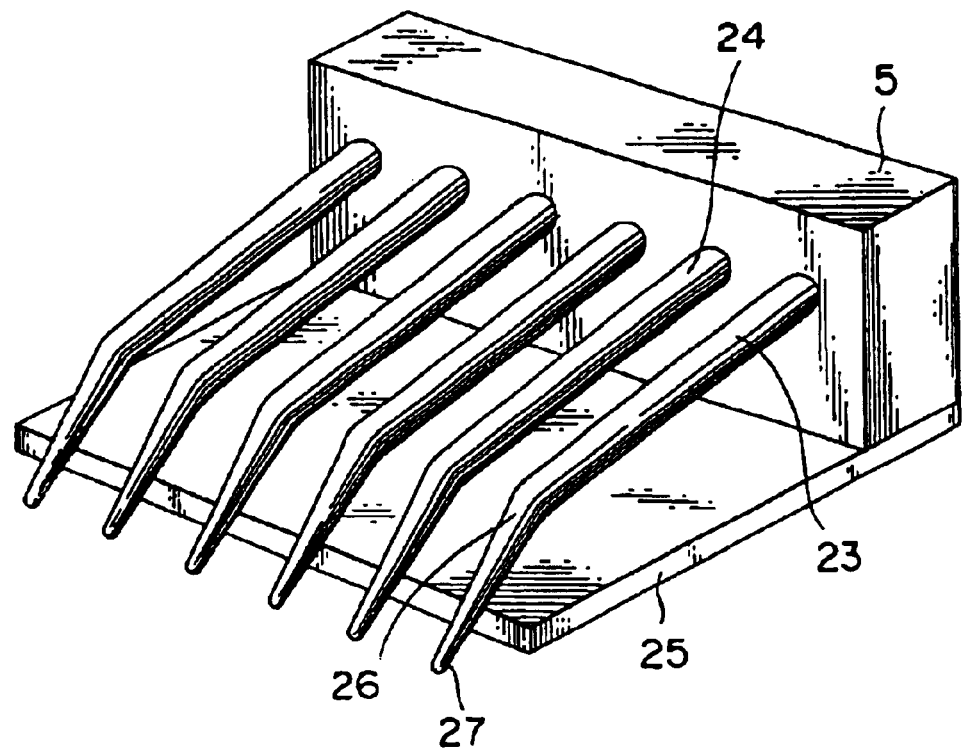
FIG. 8 is a magnified view illustrating the probe needle part of a probe card in Mode 2 of the embodiment mentioned below.

FIG. 7 is a side view illustrating a probe card 21 in Mode 2 of the embodiment of the present invention and FIG. 8 is a magnified view illustrating the probe needle part of the probe card 21.

The probe card 21 in Mode 2 of the embodiment is provided with antireflection plates 25 which are adapted to cover the parts of the probe needles 23 extending from the basal parts 24 through the bent parts 26.

The antireflection plates 25 are preferred to be insulating rigid resin plates having a low light reflection factor. For example, low-reflection acrylic plates, epoxy resin plates, plates formed by applying a delustering coat to ordinary acrylic plates and epoxy resin plates, and plates having fine scratches formed on the surfaces thereof by way of a treatment for lowering the reflection of light and consequently resembling obscure glasses in appearance are advantageously used. Resinous boards which permit easy fabrication without reference to the kind of substance used are also used advantageously.

Optionally, the antireflection plates 25 may be formed of an insulating resin film in the place of a rigid material. This resin film is tolerable so long as it is not caught on the needle tips because it does not affect the measurement itself even when it directly contacts a device which is an object under test.

The antireflection plates 25 have a length enough to cover the bent parts 26 and nevertheless expose the tip parts of the probe needles 23. The antireflection plates 25 are attached by adhesion to the resin members 5 which serve the purpose of fixing the probe needles 23.

Figure 9:
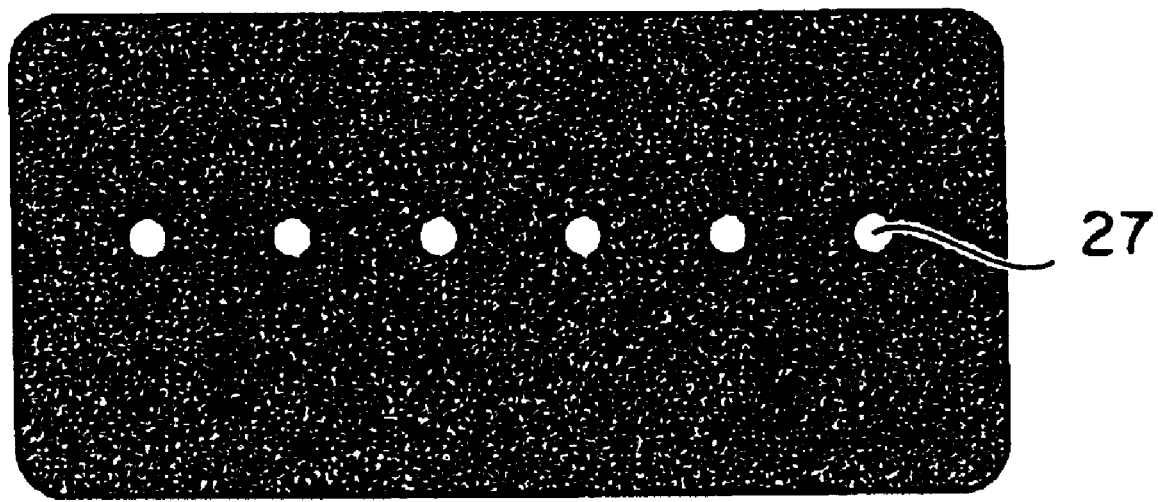
FIG. 9 is a diagram illustrating in type section the reflection by illumination of the probe needle part of the probe card in Mode 2 of the embodiment mentioned below.

FIG. 9 is a diagram illustrating in type section the reflection by illumination of the probe needle part of the probe card in Mode 2 of the embodiment.

Since the probe card 21 in Mode 2 of the embodiment is covered with the antireflection plates 25 to the very proximity of the needle tips 27 as illustrated in the diagram, the needle tips 27 alone reflect the light of illumination to the extent of enabling the image thereof to be easily perceived.

According to Mode 2 of the embodiment, since the provision of the antireflection plates 25 results in preventing the light of illumination from impinging on the bent parts 26 which reflect the light most strongly, the reflection of right from the bent parts 26 can be eliminated and the ratio of perception of the needle tips 27 can be enhanced.

The modes of embodiment of this invention have been described. Needless to mention, this invention does not need to be limited to these modes of embodiment but may be variously modified by a person of ordinary skill in the art.

According to the probe card of this invention which has been described above, since the bent parts of the probe needles are subjected to a treatment for lowering the reflection of light, it is made possible to repress the reflection of light from the bent parts of the probe needles which reflect the light most strongly in all the cantilever type probe card and enhance the ratio of perception of the image of needle tips.

Further, according to the probe card of this invention, since the antireflection plates are so disposed as to cover the bent parts of the probe needles, it is made possible to prevent the light of illumination from impinging on the bent parts of the probe needles which reflect the right most strongly in all the cantilever type probe card, eliminate the reflection of light from these bent parts, and enhance the ratio of perception of the image of needle tips.

Then, according to the method of this invention for the production of a probe card, since the probe needles are furnished with a delustering coat by way of a treatment for lowering the reflection of light after the probe card has been manufactured, even the probe card which has been already manufactured can be easily subjected to the treatment for lowering the reflection of light so as to enhance the ratio of perception of the needle tips.

Further, according to the method of this invention for the production of a probe card, since the antireflection plates are only required to be attached after the probe card has been manufactured, this procedure can be applied to the probe card which has been already manufactured and the ratio of perception of the needle tips can be enhanced.

While the invention has been described with reference to the preferred embodiment thereof, it will be appreciated by those of ordinary skill in the art that modifications can be made to the parts that comprise the invention without departing from the spirit and scope thereof.

What is claimed is:

1. A cantilever type probe card having probe needles disposed on the main body of the probe card, said probe needles being furnished respectively with bent parts having the leading terminal; thereof directed toward an object under test and the parts including at least said bent parts having formed thereon reflection-lowering parts capable of repressing the reflection of light.

2. A cantilever type probe card according to claim 1, wherein said reflection-lowering parts are formed by the application of a delustering coat.

3. A cantilever type probe card according to claim 1, wherein said reflection-lowering parts are formed by the application of a delustering treatment by brushing.

4. A cantilever type probe card having probe needles disposed on the main body of the probe card, said probe needles being furnished respectively with bent parts having the leading terminals thereof directed toward an object under test and said bent parts being furnished with antireflection plates.

* * * * *